United States Patent
Baars et al.

(10) Patent No.: US 8,742,510 B2
(45) Date of Patent: Jun. 3, 2014

(54) SEMICONDUCTOR DEVICES WITH REPLACEMENT GATE STRUCTURES HAVING CONDUCTIVE CONTACTS POSITIONED THEREBETWEEN

(71) Applicant: GLOBALFOUNDRIES Inc., Grand Cayman (KY)

(72) Inventors: Peter Baars, Dresden (DE); Andy Wei, Queensbury, NY (US); Richard Carter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/718,158

(22) Filed: Dec. 18, 2012

(65) Prior Publication Data

US 2013/0126980 A1 May 23, 2013

Related U.S. Application Data

(62) Division of application No. 13/230,360, filed on Sep. 12, 2011, now Pat. No. 8,357,978.

(51) Int. Cl.
   *H01L 21/70* (2006.01)
   *H01L 21/02* (2006.01)
   *H01L 23/48* (2006.01)
   *H01L 21/8238* (2006.01)

(52) U.S. Cl.
   USPC ........... 257/368; 257/384; 257/387; 257/750; 438/229

(58) Field of Classification Search
   USPC ................. 257/368, 384, 387, 750; 438/229
   See application file for complete search history.

(56) References Cited

U.S. PATENT DOCUMENTS

| | | | | |
|---|---|---|---|---|
| 5,663,086 | A * | 9/1997 | Rostoker et al. | 438/210 |
| 6,274,468 | B1 * | 8/2001 | Hsu | 438/586 |
| 6,326,270 | B1 * | 12/2001 | Lee et al. | 438/279 |
| 7,981,740 | B2 | 7/2011 | Lenski et al. | 438/229 |
| 2002/0098640 | A1 * | 7/2002 | Kim et al. | 438/241 |
| 2002/0197839 | A1 | 12/2002 | Dokumaci et al. | 438/587 |
| 2003/0107088 | A1 | 6/2003 | Inumiya et al. | 257/368 |
| 2005/0040469 | A1 * | 2/2005 | Doczy et al. | 257/369 |
| 2006/0035425 | A1 * | 2/2006 | Carter et al. | 438/199 |
| 2008/0042174 | A1 | 2/2008 | Belyansky et al. | 257/288 |
| 2008/0308936 | A1 * | 12/2008 | Costrini et al. | 257/750 |
| 2009/0001480 | A1 * | 1/2009 | Cheng | 257/387 |
| 2010/0038723 | A1 * | 2/2010 | Babich et al. | 257/384 |
| 2010/0084712 | A1 | 4/2010 | Kohli | 257/368 |
| 2010/0193872 | A1 | 8/2010 | Carter et al. | 257/368 |
| 2010/0327362 | A1 | 12/2010 | Richter et al. | 257/368 |
| 2011/0108930 | A1 | 5/2011 | Cheng et al. | 257/412 |
| 2011/0129980 | A1 | 6/2011 | Heinrich et al. | 438/305 |

* cited by examiner

*Primary Examiner* — Shaun Campbell
*Assistant Examiner* — Dzung Tran
(74) *Attorney, Agent, or Firm* — Amerson Law Firm, PLLC

(57) ABSTRACT

Disclosed herein are various methods of forming replacement gate structures and conductive contacts on semiconductor devices and devices incorporating the same. One exemplary device includes a plurality of gate structures positioned above a semiconducting substrate, at least one sidewall spacer positioned proximate respective sidewalls of the gate structures, and a metal silicide region in a source/drain region of the semiconducting substrate, the metal silicide region extending laterally so as to contact the sidewall spacer positioned proximate each of the gate structures. Furthermore, the device also includes, among other things, a conductive contact positioned between the plurality of gate structures, the conductive contact having a lower portion that conductively contacts the metal silicide region and an upper portion positioned above the lower portion, wherein the lower portion is laterally wider than the upper portion and extends laterally so as to contact the sidewall spacers positioned proximate each of the gate structures.

20 Claims, 7 Drawing Sheets

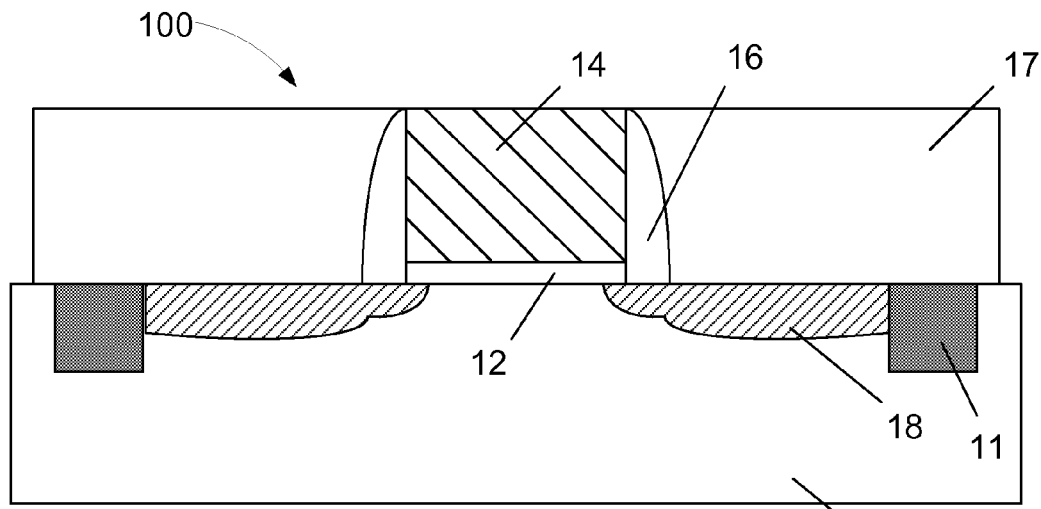
(Prior Art) Figure 1A
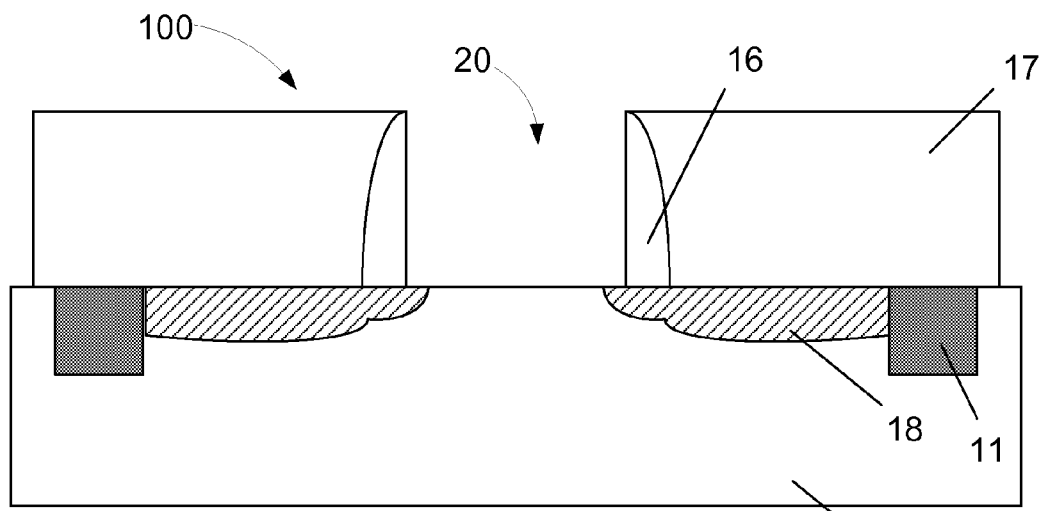
(Prior Art) Figure 1B

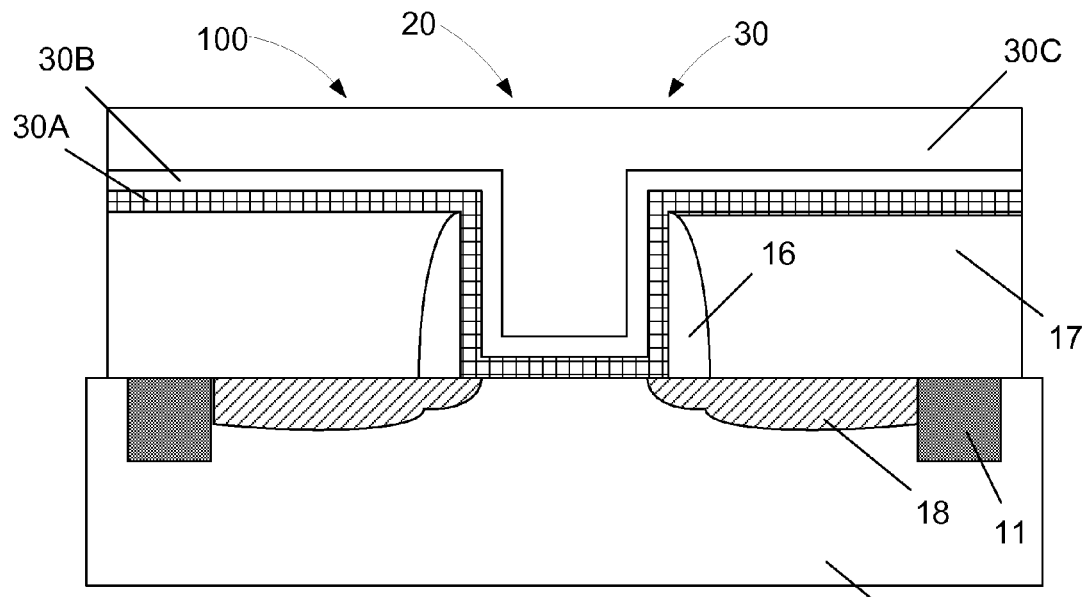
(Prior Art) Figure 1C
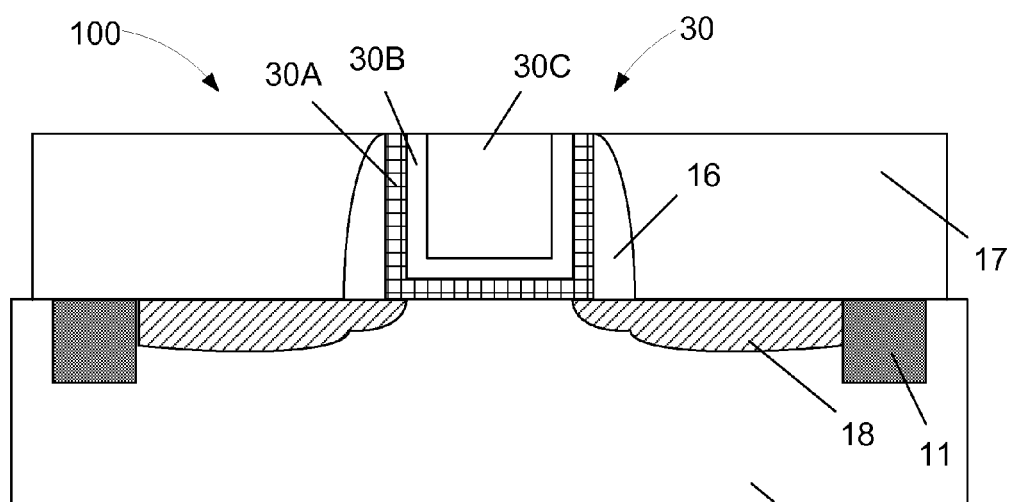
(Prior Art) Figure 1D

SEMICONDUCTOR DEVICES WITH REPLACEMENT GATE STRUCTURES HAVING CONDUCTIVE CONTACTS POSITIONED THEREBETWEEN

CROSS-REFERENCE TO RELATED APPLICATION

This is a divisional of co-pending application Ser. No. 13/230,360, filed Sep. 12, 2011.

BACKGROUND OF THE INVENTION

1. Field of the Invention

Generally, the present disclosure relates to the manufacturing of sophisticated semiconductor devices, and, more specifically, to various methods of forming replacement gate structures on semiconductor devices and devices incorporating such gate structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit elements that substantially determine performance of the integrated circuits. During the fabrication of complex integrated circuits using, for instance, MOS technology, millions of transistors, e.g., NMOS transistors and/or PMOS transistors are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped regions source/drain regions.

In a field effect transistor, the conductivity of the channel region, i.e., the drive current capability of the conductive channel is controlled by a gate electrode formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors. Thus, since the speed of creating the channel, which depends in part on the conductivity of the gate electrode, and the channel resistivity substantially determine the characteristics of the transistor, the scaling of the channel length, and associated therewith the reduction of channel resistivity and the increase of gate resistivity, are dominant design efforts used to increase the operating speed of the integrated circuits.

For many early device technology generations, the gate electrode structures of most transistor elements has comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths of on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate insulation layer in a HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a gate-last technique. As shown in FIG. 1A, the process includes the formation of a basic transistor structure 100 above a semiconducting substrate 10 in an active area defined by a shallow trench isolation structure 11. At the point of fabrication depicted in FIG. 1A, the device 100 includes a sacrificial gate insulation layer 12, a dummy or sacrificial gate electrode 14, sidewall spacers 16, a layer of insulating material 17 and source/drain regions 18 formed in the substrate 10. The various components and structures of the device 100 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopant for PMOS devices) that are implanted into the substrate using known masking and ion implantation techniques. Of course, those skilled in the art will recognize that there are other features of the transistor 100 that are not depicted in the drawings for purposes of clarity. For example, so called halo implant regions are not depicted in the drawings as well as various layers or regions of silicon germanium that are typically found in high-performance PMOS transistors. At the point of fabrication depicted in FIG. 1A, the various structures of the device 100 have been formed and one or more processes, such as a chemical mechanical polishing process (CMP) and/or a recess etching process, has been performed to remove any materials above the sacrificial gate electrode 14 (such as a protective cap layer (not shown) comprised of silicon nitride) so that the sacrificial gate electrode 14 may be removed.

As shown in FIG. 1B, one or more etching processes are performed to remove the sacrificial gate electrode 14 and the sacrificial gate insulation layer 12 to thereby define a gate opening 20 where a replacement gate structure will subsequently be formed. A masking layer that is typically used in such etching processes is not depicted for purposes of clarity. Typically, the sacrificial gate insulation layer 12 is removed as part of the replacement gate technique, as depicted herein. However, the sacrificial gate insulation layer 12 may not be removed in all applications.

Next, as shown in FIG. 1C, various layers of material that will constitute a replacement gate structure 30 are formed in the gate opening 20. In one illustrative example, the replacement gate structure 30 is comprised of a high-k gate insulation layer 30A having a thickness of approximately 2 nm, a work-function adjusting layer 30B comprised of a metal (e.g., a layer of titanium nitride with a thickness of 2-5 nm) and a bulk metal layer 30C (e.g., aluminum). Ultimately, as shown in FIG. 1D, a CMP process is performed to remove excess portions of the gate insulation layer 30A, the work-function adjusting layer 30B and the bulk metal layer 30C positioned outside of the gate opening 20 to define the replacement gate structure 30.

As device dimensions continue to shrink, e.g., 20-30 nm gate lengths and gate pitches on the order of 60-90 nm, one important aspect of the replacement gate technique is that it typically does not involve the formation of a protective cap layer above the replacement gate structure 30. Moreover, the reduction of device dimensions has made the formation of conductive contacts to the source/drain regions 18 very difficult. Such contacts are typically formed by direct patterning techniques using traditional photolithography and etching techniques. Given the decrease in device dimension, and the fact the replacement gate structure is typically not protected during the contact formation process, device designers have resorted to making the conductive contacts very small so as to hopefully, avoid the unprotected replacement gate structure 30 and to have some tolerance or "process window" for positioning the contact between adjacent gate structures. Using such techniques makes accuracy in forming such contact openings very critical. Errors in pattern alignment can ultimately result in the formation of conductive contacts that are even smaller than intended by the device designer. As a result, such excessively small conductive contacts, and the resulting underlying metal silicide regions, can increase the resistance of the contact structure and thereby reduce the performance capability of the resulting semiconductor device and integrated circuit products incorporating such devices. In a worst case scenario, such misalignment can lead to short circuits and total device failure.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to methods of forming various illustrative semiconductor devices that include replacement gate structures and conductive contacts positioned therebetween, and devices incorporating such replacement gate structures and conductive contacts. One exemplary device disclosed herein includes a plurality of gate structures positioned above a semiconducting substrate and at least one sidewall spacer positioned proximate respective sidewalls of each of the plurality of gate structures. The disclosed also includes, among other things, a metal silicide region in a source/drain region formed in the semiconducting substrate, the metal silicide region extending laterally so as to contact the at least one sidewall spacer positioned proximate each of the plurality of gate structures. Furthermore, the exemplary device includes a conductive contact positioned between the plurality of gate structures, the conductive contact having a lower portion that conductively contacts the metal silicide region and an upper portion positioned above the lower portion, wherein the lower portion is laterally wider than the upper portion and extends laterally so as to contact the at least one sidewall spacer positioned proximate each of the plurality of gate structures.

In another illustrative embodiment disclosed herein, a device includes, among other things, a first gate structure positioned above a semiconducting substrate and a first sidewall spacer positioned proximate sidewalls of the first gate structure. The disclosed device further includes a second gate structure positioned above the semiconducting substrate and a second sidewall spacer positioned proximate sidewalls of the second gate structure. Additionally, the illustrative device includes a metal silicide region positioned in a contact region of the semiconducting substrate between the first and second gate structures, the metal silicide region extending laterally from the first sidewall spacer to the second sidewall spacer. Moreover, the device also includes a contact element contacting the metal silicide region, the contact element including an upper portion and a lower portion having a greater lateral width than the upper portion, wherein the lower portion extends laterally so as to contact each of the first and second sidewall spacers.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art process flow for forming a semiconductor device using a gate last approach.

Figure 2A:
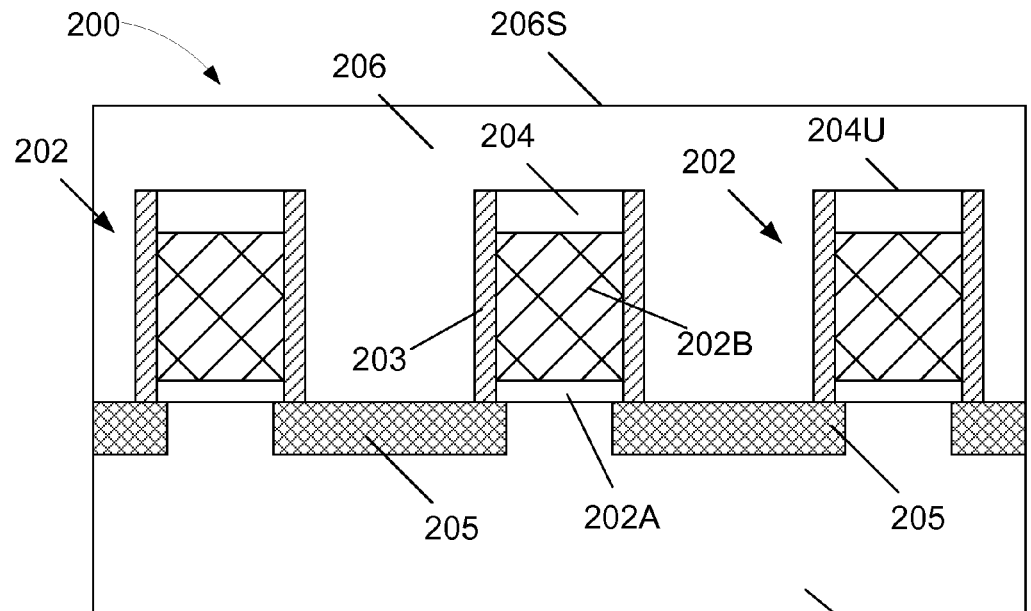
FIGS. 2A-2J depict one illustrative process flow for forming replacement gate structures on semiconductor devices and devices incorporating such gate structures.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming replacement gate structures on semiconductor devices and devices incorporating such gate structures. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 2A-2J, various illustrative embodiments of the methods disclosed herein will now be described in more detail.

FIG. 2A is a simplified view of an illustrative semiconductor device 200 at an early stage of manufacturing that is formed above a semiconducting substrate 201. At the point of fabrication depicted in FIG. 2A, the device 200 includes a plurality of schematically depicted sacrificial gate structures 202 and a plurality of schematically depicted source/drain regions 205 formed in the substrate 201. Each of the sacrificial gate structures 202 comprises an illustrative sacrificial gate insulation layer 202A and a "dummy" of sacrificial gate electrode 202B. Also depicted are illustrative sidewall spacers 203 and an illustrative gate cap layer 204. A layer or material 206 such as a flowable oxide material or a spin-on glass (SOG) material is formed above the substrate 201. The layer of material 206 should be formed of a material that will reliably overfill the spaces between adjacent gate electrode structures 202 such that its upper surface 206S is above the upper surface 204U of the gate cap layers 204. The substrate 201 may have a variety of configurations, such as the depicted bulk silicon configuration. The substrate 201 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 201 may also be made of materials other than silicon.

The various components and structures of the device 200 may be formed using a variety of different materials and by performing a variety of known techniques. For example, the sacrificial gate insulation layer 202A may be comprised of silicon dioxide, the sacrificial gate electrode 202B may be comprised of polysilicon, the sidewall spacers 203 and the gate cap layer 204 may be comprised of silicon nitride. The source/drain regions 205 may be comprised of implanted dopant materials (N-type dopants for NMOS devices and P-type dopants for PMOS devices) that are implanted into the substrate 201 using known masking and ion implantation techniques. Of course, those skilled in the art will recognize that there are other features of the device 200 that are not depicted in the drawings for purposes of clarity. For example, so called halo implant regions are not depicted in the drawings as well as various layers or regions of silicon germanium that are typically found in high-performance PMOS transistors.

To arrive at the structure depicted in FIG. 2A, the gate electrode structure 202 and the gate cap layer 204 are typically formed by depositing various layers of material and performing one or more etching processes to define the basic stack of materials shown in FIG. 2A. Thereafter, an initial ion implantation process performed with an N-type dopant, e.g., arsenic, phosphorous, etc., or P-type dopant, e.g., boron, (depending upon whether the device under construction is an NMOS transistor or a PMOS transistor, respectively) to form the extension implant regions in the substrate 201. Then, the sidewall spacers 203 are formed proximate the gate electrode structure 202 by depositing a layer of spacer material and thereafter performing an anisotropic etching process. Thereafter, a second ion implantation process is then performed with an N-type dopant or a P-type dopant (depending upon the type of device under construction), to form the so-called deep source-drain implant regions in the substrate 201. The ion implantation process performed to form the deep source-drain implant regions is typically performed using a higher dopant dose and it is performed at higher implant energy than the ion implantation process that was performed to form the extension implant regions.

Figure 2B:
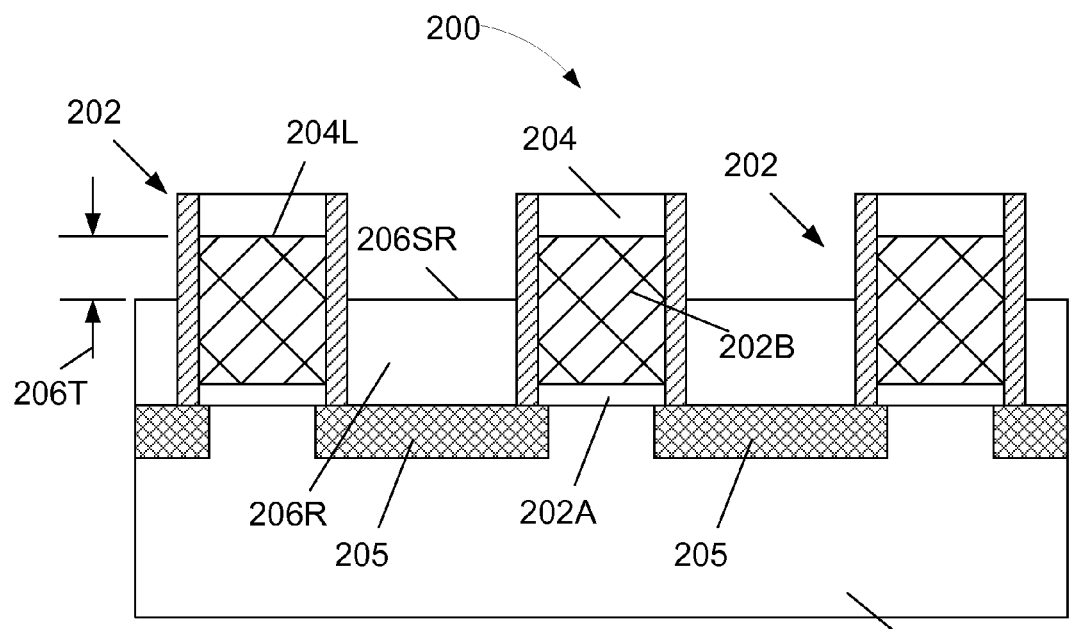

Thereafter, as shown in FIG. 2B, the overall thickness of the layer of material 206 is reduced such that the upper surface 206SR of the layer of material 206 is below the lower surface 204L of the gate cap layer 204 by a distance 206T. In one illustrative embodiment, the distance 206T may range from approximately 10-15 nm. The thickness of the layer of material 206 may be reduced using a variety of techniques. In one illustrative example, the thickness of the layer of material 206 may be reduced by performing an initial chemical mechanical planarization (CMP) process that stops on the upper surface 204U of the gate cap layers 204 to remove the bulk of the layer of material 206. Thereafter, an etching process may be performed to remove the remainder of the layer of material 206 until such time as the desired amount of material has be removed and the surface 206SR of the reduced layer of material 206R as positioned at its desired location. Alternatively, the thickness of the layer of material 206 may be reduced solely by etching, i.e., the CMP process may be omitted. In one illustrative embodiment, the etching process performed on the layer of material 206 may be a dry chemical etching process. In a more specific example, the etching process may be a dry HF isotropic etching process as disclosed in U.S. Pat. No. 7,877,161 assigned to Tokyo Electron Limited, which is hereby incorporated by reference in its entirety.

Figure 2C:
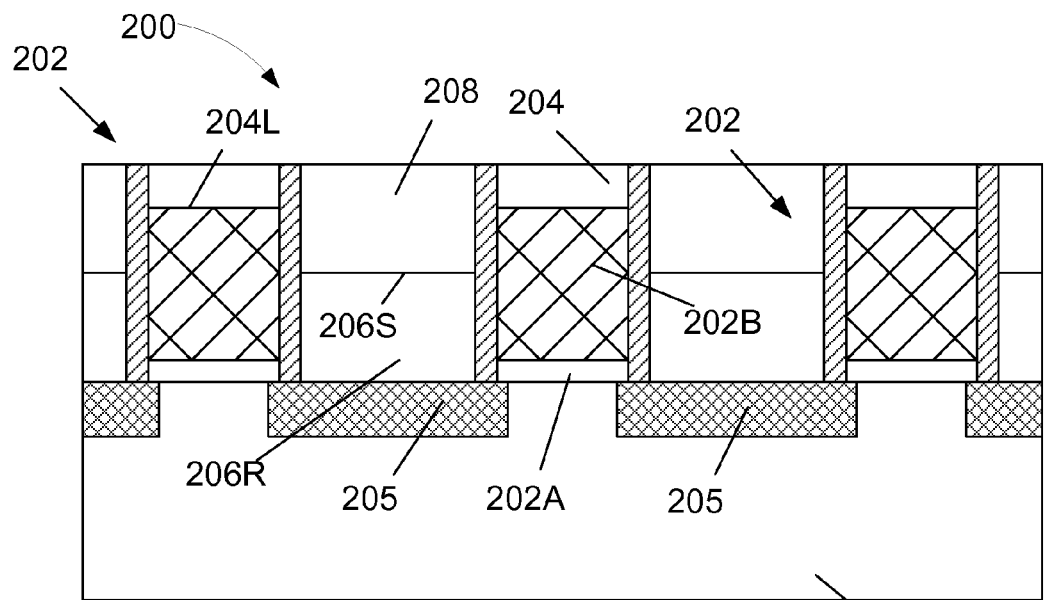

Next, as shown in FIG. 2C, a layer of material 208 is formed above the device 200. In one illustrative embodiment, the layer of material 208 is comprised of silicon nitride, silicon oxynitride, etc. The layer of material 208 may be formed by performing a variety of techniques and its thickness may vary depending upon the particular application. In one illustrative embodiment, the layer of material 208 is a layer of silicon nitride having a thickness of about 20-30 nm that is initially formed by performing a high-temperature (up to 650 C) low pressure conformal chemical vapor deposition (LPCVD) process. After the layer of material 208 is initially deposited, a CMP process is performed that stops on the gate cap layers 204 to thereby result in the structure depicted in FIG. 2C.

Figure 2D:
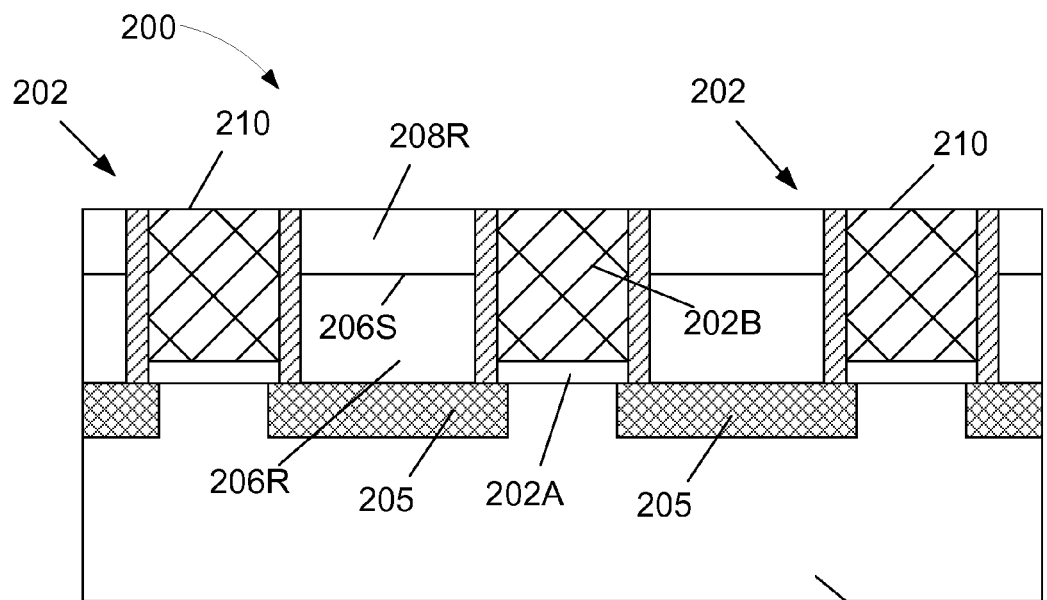
Figure 2E:
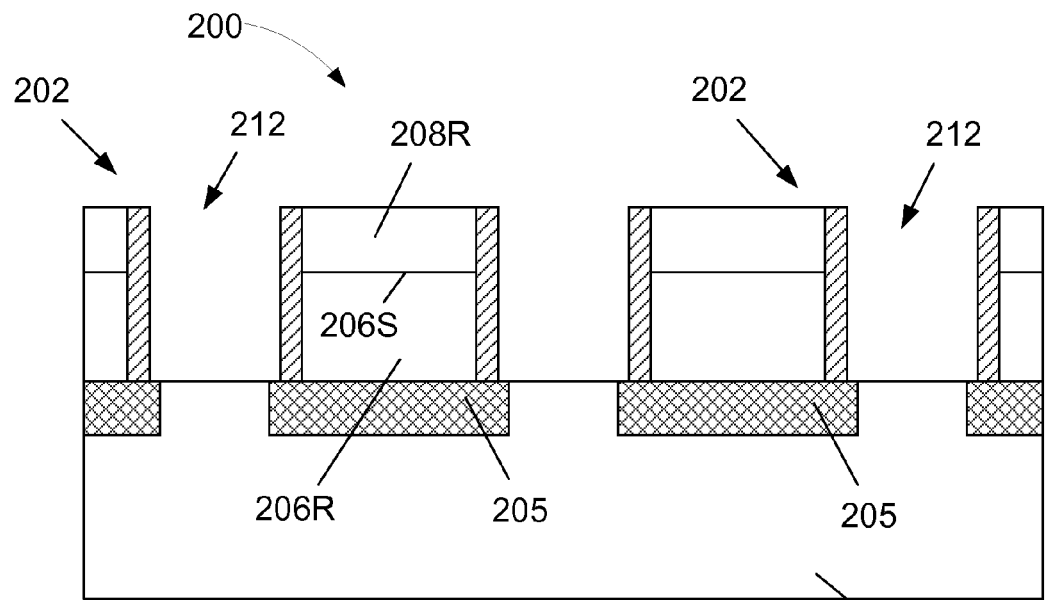

Next, as shown in FIG. 2D, a CMP process is performed to expose the upper surface 210 of the sacrificial gate electrode 202B for further processing. Then, as shown in FIG. 2E, in one illustrative embodiment, one or more etching processes are performed to remove the sacrificial gate electrode 204B and the sacrificial gate insulation layer 204A to thereby define a gate opening 212 where a replacement gate structure will subsequently be formed. A masking layer that is typically used in such etching processes is not depicted so as not to obscure the present inventions. Typically, the sacrificial gate insulation layer 202A is removed as part of the replacement gate technique, as depicted herein. However, the sacrificial gate insulation layer 202A may not be removed in all applications.

Figure 2F:
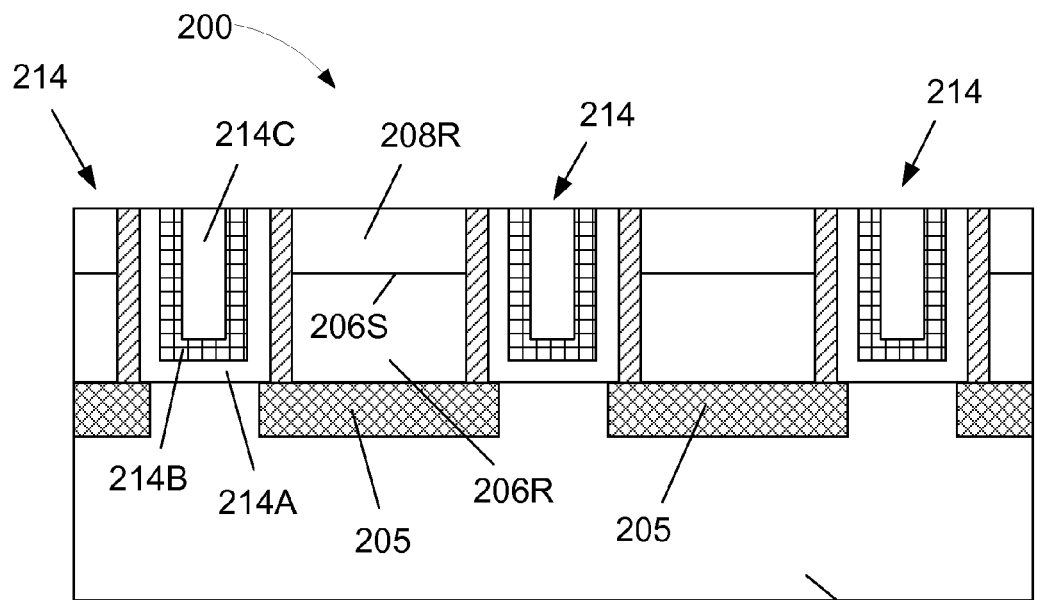

Next, as shown in FIG. 2F, replacement gate structures 214 are formed in the gate openings 212. In the illustrative example depicted herein, the replacement gate structure 214 is comprised of a high-k gate insulation layer 214A having a thickness of approximately 2 nm, a work-function adjusting layer 214B comprised of a metal (e.g., a layer of titanium nitride with a thickness of 2-5 nm) and a bulk metal layer 214C (e.g., aluminum). In one embodiment, the various layers of material that comprise the replacement gate structure 214 are conformally deposited in the gate openings 212 and above the device 200. Thereafter, a CMP process is performed to remove the excess portions of those deposited layers of material that are positioned outside of the gate opening 212 to define the replacement gate structure 214. As will be recognized by those skilled in the art after a complete reading of the present application, the replacement gate structure 214 may be of any desired construction and comprised of any of a variety of different materials. For example, the replacement gate structure 214 may have more metal layers than the two illustrative metal layers depicted in FIG. 2F, or it may only have a single layer of metal. The metal layer(s) in the replacement gate structure 214 may be made from many different metals in addition to those identified above, such as lanthanum, tantalum, tantalum nitride, titanium, titanium nitride, etc. Additionally, the replacement gate structure 214 for an NMOS device may have different material combinations as compared to a replacement gate structure 214 for a PMOS device. Thus, the particular details of construction of replacement gate structure 214, and the manner in which such replacement gate electrode structure 214 is formed, should not be considered a limitation of the present invention. Moreover, the methods disclosed herein may be employed on replacement gate structures 214 that do not employ the illustrative high-k gate insulation layer 214A.

Figure 2G:
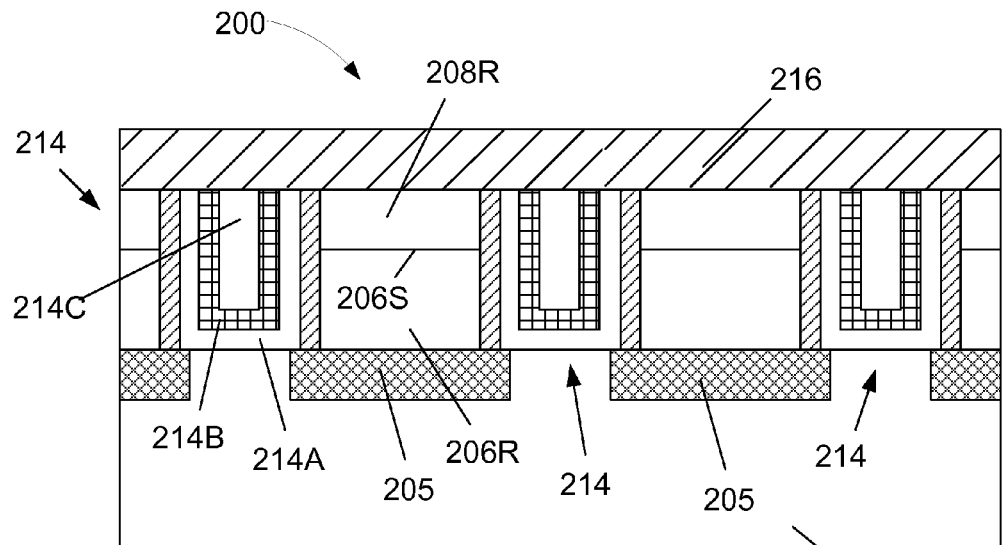

Next, as shown in FIG. 2G, a cap layer 216 is deposited above the device 200. In one illustrative embodiment, the cap layer 216 is comprised of silicon nitride, silicon oxynitride, etc. The cap layer 216 may be formed by performing a variety of techniques and its thickness may vary depending upon the particular application. In one illustrative embodiment, cap layer 216 is a layer of silicon nitride having a thickness of about 10-20 nm that is initially formed by performing a CVD process.

Figure 2H:
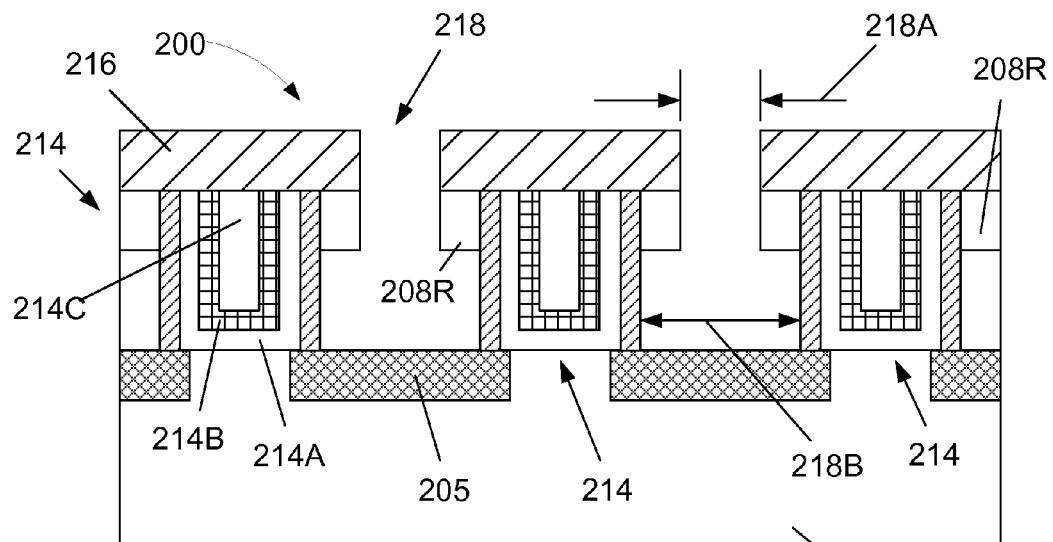

Then, as shown in FIG. 2H, one or more etching processes are performed through a patterned masking layer (not shown), e.g., a photoresist mask, to form contact openings 218 for conductive contacts that will be formed to provide electrical connection to the underlying source/drain regions 205 in the substrate 201. More specifically, in one illustrative embodiment, where the cap layer 216 and the reduced thickness material layer 208R are made of silicon nitride, an initial common etching process may be performed on those layers to define the initial opening that extends through the second and third layers 208R, 216. This common etching process is performed with an etching chemistry the removes the second and third material layers 208R, 216 selectively relative the first material layer 206R. Thereafter, another etching process, with a different etch chemistry, is performed to remove the material layer 206R, e.g., an oxide in the illustrative embodiment depicted herein. This latter etching process has the effect of defining a final contact opening that has a bottom portion that is wider than an upper portion of the opening. That is, using the methodologies disclosed herein, the contact opening 218 has a narrower dimension 218A at the upper portion of the opening 218 and a wider dimension 218B at the bottom portion of the opening 218. In one illustrative embodiment, the dimension 218A may be as small as can be readily patterned using current-day photolithography tools and equipment, e.g., 15-20 nm, while the dimension 218B may be approximately 30-50 nm, based upon current-day devices with a gate pitch ranging from approximately 60-80 nm.

Figure 2I:
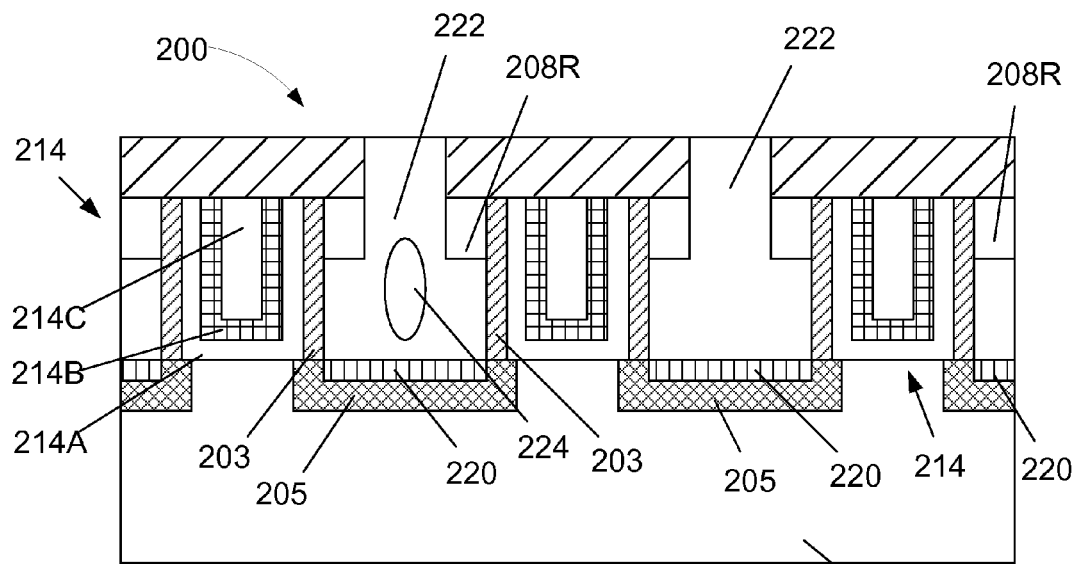

Next, as shown in FIG. 2I, metal silicide regions 220 are formed in the source/drain regions 205 formed in the substrate 201. In a field effect transistor, metal silicide regions are typically formed in the source/drain regions of a transistor to reduce the resistance when a conductive contact is formed to establish electrical connection to the source/drain regions. The metal silicide regions 220 depicted herein may be made using a variety of different refractory metals, e.g., nickel, platinum, cobalt, etc., or combinations thereof, and they may be formed using techniques that are well known to those skilled in the art. The typical steps performed to form metal silicide regions are: (1) depositing a layer of refractory metal; (2) performing an initial heating process causing the refractory metal to react with underlying silicon containing material; (3) performing an etching process to remove unreacted portions of the layer of refractory metal and (4) performing an additional heating process to form the final phase of the metal silicide. The details of such silicidation processes are well known to those skilled in the art. In the illustrative example depicted herein, the metal silicide regions 220 may be formed by initially performing a highly-conformal atomic layer deposition (ALD) process or a RF physical vapor deposition (PVD) process to deposit a layer of, for example, nickel, having a thickness of, for example, 5-15 nm. Thereafter, the anneal—etch—anneal process sequence described above is performed to complete the formation of the metal silicide regions 220. In one illustrative embodiment, the metal silicide regions 220 may have a thickness of about 10-20 nm. Note that using the novel techniques disclosed herein, wherein the final contact opening 218 has a wider dimension 218B at the bottom of the opening 218 than at the top of the opening 218, the metal silicide regions 220 are wider than metal silicide regions that can be formed when the contact opening is formed using traditional photolithography and etching techniques. Additionally, as will be appreciated by those skilled in the art after reading the present application, by performing the illustrative steps depicted herein, the final contact opening 218 and the full-width metal silicide regions 220 are formed without using self-aligned contact formation techniques. The full-width metal silicide regions 220 disclosed herein that extend between and contact the sidewall spacers 203 positioned proximate adjacent replacement gate structures 214 help to ensure the contact resistance remains low or at least within range anticipated by device designers. Thereafter, the conductive contact 222 is formed in the contact opening 218. The conductive contact 222 has a stepped configuration that mirrors that of the contact opening 218, i.e., the conductive contact 222 has a lower portion that is wider than the upper portion of the conductive contact 222. In one illustrative embodiment, and the lower, wider portion of the conductive contact 222 contacts the sidewall spacers 203 that are positioned proximate the adjacent replacement gate structures 214. The conductive contact 222 may be comprised of a variety of materials, e.g., Ti, TiN, tungsten, aluminum, etc., and it may be form by depositing the material in the contact opening using, for example, a RFPVD process, and thereafter performing a CMP process to remove excess portions of the conductive material positioned outside of the contact opening 218.

Given the relatively wider contact area at the bottom of the final contact opening 218, the inadvertent formation of illustrative voids 224 in the conductive contact 222 is not a problematic as would be the case if the contact opening had a uniform width throughout its length, as would be the case if the contact opening was directly patterned, i.e., if the contact opening was formed using traditional photolithography and etching techniques. More specifically, due to the wider contact area at the bottom of the conductive contact 222, the lower portion of conductive contact 222 is essentially larger than comparative prior art contacts, and thus the inclusion of inadvertent voids 224 does not have as significant effect in reducing the resistance of the conductive contacts 222 disclosed herein as the resistance is mainly driven by the full-width metal silicide regions 220 and not the metal fill of the conductive contacts 222.

Figure 2J:
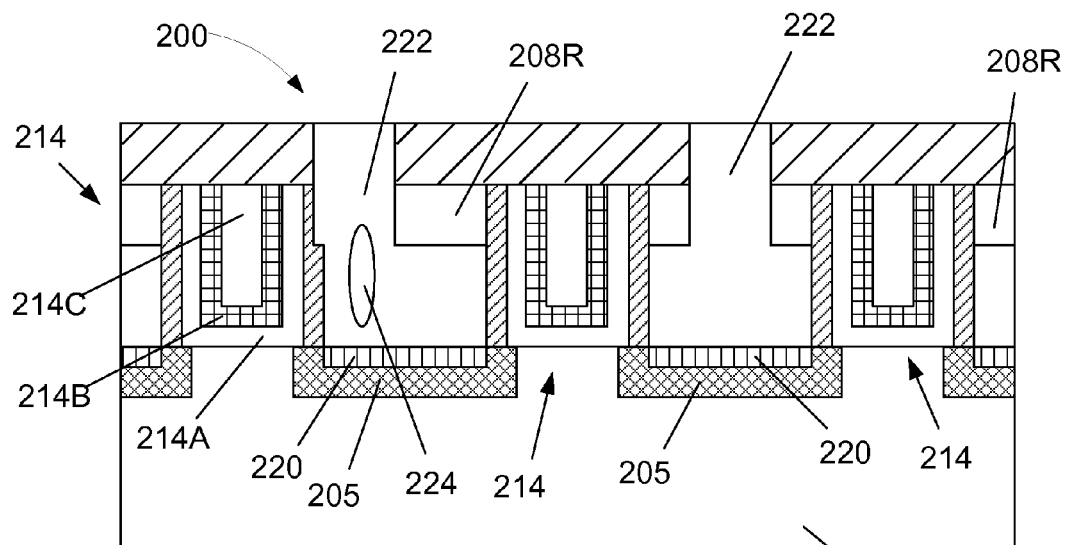

FIG. 2J depicts another potential advantage using the methods and devices disclosed herein. More specifically, due to the wider contact area at the bottom of the conductive contact 220, misalignment of the initial contact opening and the conductive contact 220 formed in the final contact opening 218, as shown for the conductive contact 220 on the left in FIG. 2J, may be more easily tolerated. That is, given the larger size of the conductive contact 220 and the full-width metal silicide regions 220, a misaligned conductive contact 220 will still have sufficient contact area to the source/drain regions 205 such that the contact resistance does not increase beyond acceptable levels.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A device, comprising:
    a plurality of gate structures positioned above a semiconducting substrate, each of said plurality of gate structures comprising a gate electrode;
    a metal silicide region in a source/drain region formed in said semiconducting substrate, said metal silicide region extending laterally so as to contact a first sidewall spacer positioned proximate a first one of said plurality of gate structures and a second sidewall spacer positioned proximate a second one of said plurality of gate structures; and
    a conductive contact positioned between said plurality of gate structures, said conductive contact comprising a lower portion that conductively contacts said metal silicide region and an upper portion positioned above said lower portion, wherein said lower portion is laterally wider than said upper portion and extends laterally so as to contact each of said first and second sidewall spacers and at least part of said upper portion is positioned between said first and second sidewall spacers and below an upper surface of said gate electrode of each of said first and second gate structures.

2. The device of claim 1, wherein said upper portion of said conductive contact has a lateral width that ranges from approximately 15-25 nm and said lower portion has a lateral width that ranges from approximately 30-50 nm.

3. The device of claim 1, wherein each of said plurality of gate structures comprises at least one metal layer.

4. The device of claim 3, wherein each of said plurality of gate structures comprises a high-k dielectric material.

5. The device of claim 1, wherein each of said plurality of gate structures comprise a transistor element having a same conductivity type.

6. The device of claim 1, wherein said lower portion of said contact element contacts a substantially vertical lower sidewall surface portion of each of said first and second sidewall spacers.

7. The device of claim 6, further comprising a dielectric material contacting a substantially vertical upper sidewall surface portion of each of said first and second sidewall spacers, wherein said dielectric material is positioned between said upper portion of said contact element and said first and second sidewall spacers.

8. A device, comprising:
    a first gate structure positioned above a semiconducting substrate;
    a first sidewall spacer positioned proximate sidewalls of said first gate structure;
    a second gate structure positioned above said semiconducting substrate;
    a second sidewall spacer positioned proximate sidewalls of said second gate structure;
    a metal silicide region positioned in a contact region of said semiconducting substrate between said first and second gate structures, said metal silicide region extending laterally between and contacting each of said first sidewall spacer and said second sidewall spacer; and
    a contact element contacting said metal silicide region, said contact element comprising an upper portion and a lower portion having a greater lateral width than said upper portion, wherein said lower portion extends laterally so as to contact each of said first and second sidewall spacers.

9. The device of claim 8, wherein each of said first and second gate structures comprise a gate insulation layer comprising a high-k dielectric material and a gate electrode comprising at least one layer of metal gate electrode material.

10. The device of claim 8, wherein said lateral width of said lower portion of said contact element is in the range of approximately 30-50 nm.

11. The device of claim 8, wherein said lateral width of said upper portion of said contact element is in the range of approximately 15-25 nm.

12. The device of claim 8, wherein each of said first gate structure comprises a first transistor element and said second gate structure comprises a second transistor element having a same conductivity type as said first transistor element.

13. The device of claim 8, wherein said contact region comprises a source/drain region in said semiconducting substrate.

14. The device of claim 8, wherein said contact element comprises a conductive metal.

15. The device of claim 8, wherein said contact element comprises a void region.

16. The device of claim 8, wherein said lower portion of said contact element contacts a substantially vertical lower sidewall surface portion of each of said first and second sidewall spacers.

17. The device of claim 16, further comprising a dielectric material contacting a substantially vertical upper sidewall surface portion of at least one of said first and second sidewall spacers, wherein said dielectric material is positioned between said upper portion of said contact element and said at least one of said first and second sidewall spacers.

18. A device, comprising:
a first gate structure positioned above a semiconducting substrate;
a first vertical sidewall spacer structure positioned proximate sidewalls of said first gate structure;
a second gate structure positioned above said semiconducting substrate;
a second vertical sidewall spacer structure positioned proximate sidewalls of said second gate structure;
a metal silicide region positioned in a contact region of said semiconducting substrate between said first and second gate structures, said metal silicide region extending laterally between and contacting each of said first and second vertical sidewall spacer structures; and
a contact element positioned between said first and second vertical sidewall spacer structures and contacting said metal silicide region, said contact element comprising a lower contact portion that extends laterally so as to contact a lower sidewall surface portion of each of said first and second vertical sidewall spacer structures and upper contact portion that is narrower than said lower contact portion.

19. The device of claim 18, further comprising a dielectric material positioned above said lower contact portion, wherein said dielectric material contacts an upper sidewall surface portion of at least one of said first and second vertical sidewall spacer structures and is positioned between said upper contact portion and said upper sidewall surface portion of said at least one of said first and second vertical sidewall spacer structures.

20. The device of claim 18, further comprising a dielectric material positioned above said lower contact portion, wherein said dielectric material contacts an upper sidewall surface portion each of said first and second vertical sidewall spacer structures and is positioned between said upper contact portion and said upper sidewall surface portion of each of said first and second vertical sidewall spacer structures.

\* \* \* \* \*